United States Patent
Park et al.

(10) Patent No.: US 7,541,735 B2
(45) Date of Patent: Jun. 2, 2009

(54) ORGANIC ELECTROLUMINESCENT DEVICE HAVING A TRANSPARENT LAYER

(75) Inventors: Jin-Woo Park, Yongin-si (KR); Seoung-Yoon Ryu, Seoul (KR); Hun Kim, Suwon-si (KR); Yasuhiro Chiba, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 257 days.

(21) Appl. No.: 10/992,367

(22) Filed: Nov. 19, 2004

(65) Prior Publication Data

US 2005/0151468 A1 Jul. 14, 2005

(30) Foreign Application Priority Data

Nov. 21, 2003 (KR) ............... 10-2003-0083051

(51) Int. Cl.
*H05B 33/00* (2006.01)
(52) U.S. Cl. ............... 313/504; 313/506; 428/690
(58) Field of Classification Search .......... 313/504–506
See application file for complete search history.

(56) References Cited

U.S. PATENT DOCUMENTS

| | | | | |
|---|---|---|---|---|
| 4,719,152 A | * | 1/1988 | Ohta et al. ............... | 428/432 |
| 5,847,506 A | * | 12/1998 | Nakayama et al. ........ | 313/504 |
| 6,284,393 B1 | | 9/2001 | Hosokawa et al. ........ | 428/690 |
| 6,528,188 B1 | * | 3/2003 | Suzuki et al. ............ | 428/690 |
| 6,713,955 B1 | * | 3/2004 | Roitman et al. .......... | 313/504 |
| 2003/0141807 A1 | * | 7/2003 | Kawase .................. | 313/498 |

FOREIGN PATENT DOCUMENTS

| | | |
|---|---|---|
| EP | 1003229 | 5/2000 |
| EP | 1076368 | 2/2001 |
| JP | 2001-052878 | 2/2001 |
| JP | 2003-282258 | 10/2003 |
| JP | 2003-303681 | 10/2003 |
| JP | 2003-303687 | 10/2003 |
| KR | 2003-0074457 | 9/2003 |

OTHER PUBLICATIONS

Chinese Office Action dated Apr. 4, 2008.

* cited by examiner

*Primary Examiner*—Joseph L Williams
(74) *Attorney, Agent, or Firm*—H.C. Park & Associates, PLC

(57) ABSTRACT

An organic electroluminescent device, including a substrate, a first electrode layer formed on the substrate, and a second electrode layer formed on the first electrode layer. An organic layer, having a light-emitting layer, is interposed between the first electrode layer and the second electrode layer, and a transparent layer is formed on the second electrode layer. Damage to the organic layer may be prevented while maintaining a transmittance of the second electrode layer.

23 Claims, 4 Drawing Sheets

ORGANIC ELECTROLUMINESCENT DEVICE HAVING A TRANSPARENT LAYER

This application claims the benefit of Korean Patent Application No. 2003-83051, filed on Nov. 21, 2003, which is hereby incorporated by reference for all purposes as if fully set forth herein.

BACKGROUND OF THE INVENTION

1. Field of the Invention

The present invention relates to an organic electroluminescent device, and more particularly to an organic electroluminescent device with an improved electrode structure.

2. Discussion of the Related Art

Generally, electroluminescent (EL) devices are self emission displays that emit light by electrical excitation of fluorescent organic compounds, and they have many advantages over liquid crystal displays (LCDs), including a lower driving voltage, a thinner depth, a wider viewing angle, and a faster response speed. Therefore, there has been increasing interest in developing EL devices as next generation displays.

EL devices are either inorganic or organic, depending upon whether a light-emitting layer is made of an inorganic material or an organic material.

With organic EL devices, an organic layer is formed in a predetermined pattern on a glass or a transparent insulating substrate, and electrode layers are formed on the organic layer's upper surface and lower surface. Typical organic compounds used for the organic layer include a phthalocyanine, such as copper phthalocyanine (CuPc), N,N-di(naphthalene-1-yl)-N,N'-diphenyl-bezidine (NPB), or tris-8-hydroxyquinoline aluminum (Alq3).

When positive and negative voltages are applied to electrodes of the above-described organic EL devices, holes from the electrode connected to the positive voltage migrate toward a light-emitting layer via a hole transport layer, and electrons from the electrode connected to the negative voltage are injected into the light-emitting layer via an electron transport layer. The electrons and holes then recombine in the light-emitting layer to generate excitons. When the excitons change from an excited state to a ground state, fluorescent molecules of the light-emitting layer-emit light, which displays an image.

Light emitted from the light-emitting layer may be discharged through the top of the substrate. It may also be emitted through a sealing member at the bottom of the substrate, or it may be emitted in both directions. The former EL device is designated as a front emission type, and the latter is designated as a both-direction emission type.

FIG. 1 shows an organic EL device having a structure that may be used as a front emission type and a both-direction emission type. Referring to FIG. 1, an organic EL device includes a glass substrate 11, a first electrode layer 12 formed on the glass substrate 11, an organic layer 13, which may have a multilayer structure, formed on the first electrode layer 12, a second electrode layer 14, which may be made of a metal, formed on the organic layer 13, and a transparent auxiliary electrode layer 15 formed on the second electrode layer 14.

The first electrode layer 12 may be made of a transparent material, such as Indium Tin Oxide(ITO) or Indium Zinc Oxide(IZO), or a reflective material, such as metal. The second electrode layer 14 may be a metallic thin film. The auxiliary electrode layer 15 may be made of a transparent conductive material, such as ITO or IZO, to reinforce the conductivity of the second electrode layer 14. Therefore, light emitted from a light-emitting layer (not shown) in the organic layer 13 may be discharged through the second electrode layer 14 or through both the second electrode layer 14 and the substrate 11 to create an image.

However, in an organic EL device with the above-described structure, in order to enhance light transmittance, the second electrode layer 14 may be formed at a depth of about 100 Å. But because the layer is thin, a lack of film uniformity may occur, which may generate pinholes 14a as shown in FIG. 1. These pinholes 14a may allow defects to be formed in the EL device when the transparent auxiliary electrode layer 15 is deposited on the second electrode layer 14.

In other words, if the auxiliary electrode layer 15 is deposited by sputtering ITO or IZO, the organic layer 13, which is exposed through the pinholes 14a, may be damaged by plasma or energetic particles. This phenomenon worsens as the second electrode layer 14 decreases in thickness, because as the second electrode layer 14 becomes thinner, its uniformity worsens. As a result, the second electrode layer 14 may be distributed in an island shape, where it may insufficiently cover the organic layer 13.

When plasma or energetic particles damage the organic layer 13, its damaged portions D may act as dark spots.

In view of these problems, the second electrode layer 14 may be formed thicker, but this may lower light transmittance, thereby decreasing luminance efficiency. Furthermore, high power consumption is required to compensate for this decreased luminance efficiency.

U.S. Pat. No. 6,284,393 discloses an organic EL device including a conductive film sandwiched between a cathode and an organic layer. However, this patent is silent about problems caused by a thin cathode.

SUMMARY OF THE INVENTION

The present invention provides an organic EL device that maintains the light transmittance of a second electrode layer deposited on an organic layer and prevents damage to the organic layer.

Additional features of the invention will be set forth in the description which follows, and in part will be apparent from the description, or may be learned by practice of the invention.

The present invention discloses an organic EL device, comprising a substrate, a first electrode layer formed on the substrate, and a second electrode layer formed on the first electrode layer. An organic layer, having a light-emitting layer, is interposed between the first electrode layer and the second electrode layer, and a transparent layer is formed on the second electrode layer.

The present invention also discloses an organic EL device, comprising a substrate, a first electrode layer formed on the substrate, an organic layer formed on the first electrode layer, and a second electrode layer formed on the organic layer. A transparent conductive layer is formed on the second electrode layer, and the transparent conductive layer is within a range of about 30 Å to about 1,500 Å thick.

The present invention also discloses an organic EL device, comprising a substrate, a first electrode layer formed on the substrate, an organic layer formed on the first electrode layer, and a second electrode layer formed on the organic layer. A transparent insulating layer is formed on the second electrode layer, and the transparent insulating layer is within a range of about 30 Å to about 1,000 Å thick.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE INVENTION

Hereinafter, exemplary embodiments of the present invention will be described in detail with reference to the accompanying drawings.

Figure 1:
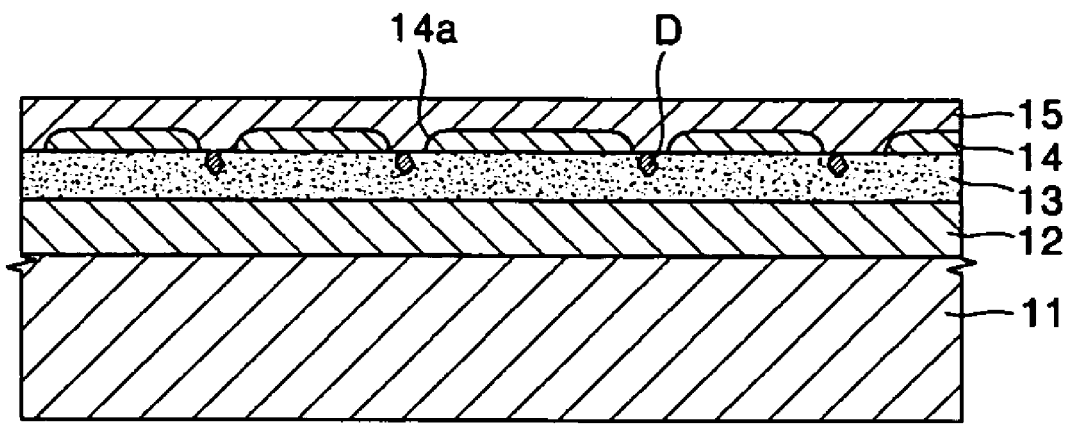
FIG. 1 is a cross-sectional view of a conventional organic EL device including a transparent second electrode layer.
Figure 2:
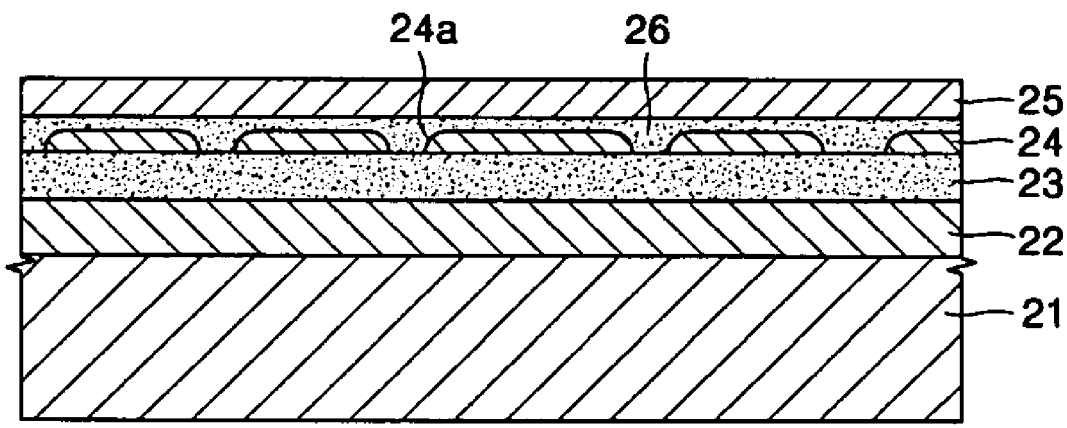
FIG. 2 is a cross-sectional view of an organic EL device including a transparent second electrode layer according to an exemplary embodiment of the present invention.

FIG. 2 shows an organic EL device according to an exemplary embodiment of the present invention. The structure of FIG. 2 may be applied to a passive matrix organic EL device and an active matrix organic EL device.

Referring to FIG. 2, an organic EL device according to an exemplary embodiment of the present invention includes a first electrode layer 22, an organic layer 23, and a second electrode layer 24 sequentially stacked on a substrate 21.

The substrate 21, which may include a plurality of TFTs and capacitors, may be made of a transparent glass, a silicon, a plastic material or other similar materials.

The organic layer 23, which is interposed between the first electrode layer 22 and the second electrode layer 24, emits light when positive and negative voltages are applied to the first and second electrode layers 22 and 24.

The organic layer 23 may be a low molecular weight or high molecular weight organic layer. The low molecular weight organic layer may have a simple- or multi-laminated structure of a hole injection layer (HIL), a hole transport layer (HTL), an organic emission layer (EML), an electron transport layer (ETL), and an electron injection layer (EIL). CuPc, NPB, or Alq3 may be used as the organic material for the low molecular weight organic layer. The low molecular weight organic layer may be formed by vacuum deposition or other similar methods.

The high molecular weight organic layer may have a structure comprised of a hole transport layer and an organic emission layer. In this case, the hole transport layer may be made of poly(ethylenedioxy)thiophene (PEDOT), and the organic emission layer may be made of a high molecular weight organic material such as poly(phenylene vinylene) (PPV) and polyfluorene. The hole transport layer and the organic emission layer may be formed by screen printing, ink-jet printing or other similar methods.

The organic layer may include other various structures.

In an exemplary embodiment of the present invention, the first electrode layer 22 may be a transparent or reflective electrode, and the second electrode layer 24 may be a transparent electrode. In the case of a both-direction emission type EL device, the first electrode layer 22 and the second electrode layer 24 may be a transparent electrode. In the case of a front emission type EL device, the first electrode layer 22 may be a reflective electrode, and the second electrode layer 24 may be a transparent electrode. The first electrode layer 22 and the second electrode layer 24 are not limited to the above-described embodiments.

The first electrode layer 22 may act as an anode, and the second electrode layer 24 may act as a cathode. Alternatively, the first electrode layer 22 may be a cathode, and the second electrode layer 24 may be an anode. In all exemplary embodiments of the present invention, the first electrode layer 22 is set as an anode, and the second electrode layer 24 is set as a cathode.

When the first electrode layer 22 is used as a transparent electrode, it may be made of ITO, IZO, ZnO, $In_2O_3$, or other like substances. On the other hand, when it is used as a reflective electrode, it may be made of Ag, Mg, Al, Pt, Pd, Au, Ni, Ir, Cr, or other like substances.

Figure 3:
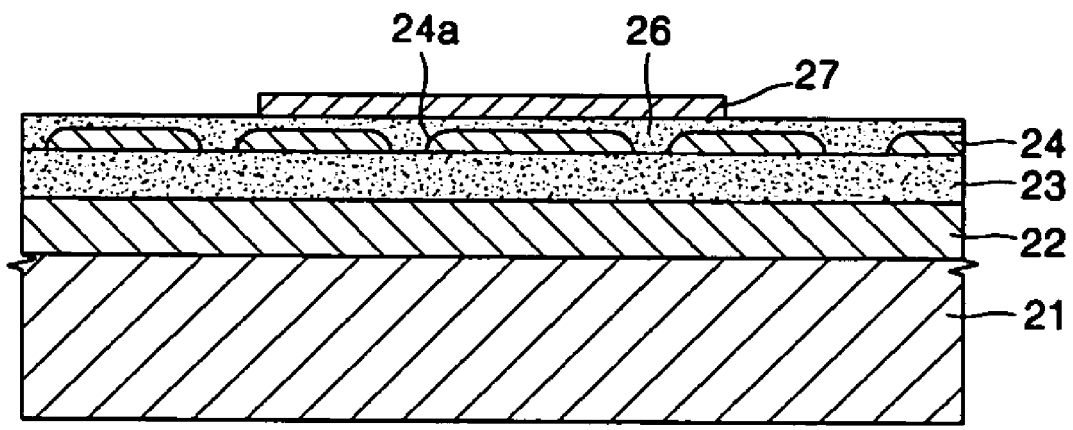
FIG. 3 is a cross-sectional view of an organic EL device including a transparent second electrode layer according to a second exemplary embodiment of the present invention.

The second electrode layer 24 may be formed as a thin metal film to permit light to pass through it. An auxiliary electrode layer 25, which may be made of a transparent material such as ITO, IZO, ZnO, or $In_2O_3$, or a bus electrode line 27 may be formed on the transparent layer 26, as shown in FIG. 2 and FIG. 3, respectively. The bus electrode line 27 may be formed as a fine line along a non-emitting pixel line. Hereinafter, exemplary embodiments of present invention will be described in view of the auxiliary electrode layer 25.

The second electrode layer 24 may be formed in the range of about 40 to about 200 Å thick by depositing a low work function metal, including Li, Ca, LiF/Ca, LiF/Al, Al, Mg, Mg alloy, or other like substances.

As described above, when the second electrode layer 24 is formed as a thin metal film, its uniformity may decrease, thereby generating pinholes 24a.

In an exemplary embodiment of the present invention, a transparent layer 26 may be formed on the second electrode layer 24 to block the pinholes 24a. The transparent layer 26 may be made of a transparent conductive or insulating material. The transparent layer 26 serves to block the pinholes 24a of the second electrode layer 24 corresponding to at least an emitting area of each pixel, thereby preventing dark spots due to damage to the organic layer 23.

In an organic EL device according to an exemplary embodiment of the present invention shown in FIG. 2, the transparent layer 26 is made of a transparent conductive material. The auxiliary electrode layer 25 is formed on the transparent layer 26, which blocks the pinholes 24a of the second electrode layer 24, thereby preventing damage to the organic layer 23. Therefore, protection of the organic layer 23 may be reinforced. Furthermore, even when the auxiliary electrode layer 25 is formed by sputtering or other like methods, plasma or energetic particle damage to the organic layer 23 may be prevented.

The transparent conductive material for the transparent layer 26 may be, but is not limited to, a metal or a conductive organic material.

In the case of the former, the transparent layer 26 may be made of a high transmittance metal such as Ca, and it may be in the range of 30 to 1,000 Å thick. If the transparent layer 26 made of a high transmittance metal is less than 30 Å thick, film uniformity may be too low, thereby decreasing the blocking effect of the pinholes 24a. On the other hand, if it is more than 1,000 Å thick, a light transmittance may excessively decrease, thereby reducing luminance efficiency. Since the transparent layer 26 made of a metal may be formed by deposition, it may not adversely effect the organic layer 23. The transparent layer 26 may be made of Li, Ca, LiF/Ca, LiF/Al, Al, Mg, Mg alloy, or other like substances.

In the case of the latter, the conductive organic material for the transparent layer 26 may be an organic material that can be used for the hole injection layer, the hole transport layer, the electron injection layer, or the electron transport layer of the organic layer 23. Further, any organic material may be used provided that it is conductive and transparent.

Examples of the conductive organic material that may be used for the transparent layer 26 include a high molecular weight material selected from the group consisting of mixtures of one or more low molecular weight materials with hole transport capacity selected from the group consisting of arylamines, phenylenes, carbazoles, stilbenes, pyrrols, and their starburst compounds, with a synthetic high molecular weight material with hole transport capacity selected from the group consisting of PEDOT(poly(3,4-ethylenedioxythiophene))/PSS(polystyrene parasulfonate), starburst compounds, arylamines, phenylenes, carbazoles, hydrazones, stilbenes, and pyrrols or one or more high molecular weight materials selected from the group consisting of polystyrenes, poly(styrene-butadiene) copolymers, polymethyl methacrylates, polyalphamethylstyrenes, styrene-methyl methacrylate copolymers, polybutadienes, polycarbonates, polyethylterephthalates, polyester sulfonates, polyarylates, fluorinated polyimides, transparent fluorine resins, and transparent acrylic resins; oxazole compounds; isoxazole compounds; triazole compounds; isothiazole compounds;

oxadiazole compounds; thiadiazole compounds; perylene compounds; aluminum complexes (for example, Alq3, BAlq, SAlq, Almq3); and gallium complexes (for example, Gaq'20Piv, Gaq'20Ac, 2(Gaq'2)).

The transparent layer 26, when made of a conductive organic material, may be formed in the range of about 100 to about 1,000 Å thick. If the transparent layer 26 made of a conductive organic material is less than 100 Å thick, an underlying emitting area may be damaged during sputtering for the auxiliary electrode layer 25. On the other hand, if it is more than 1,500 Å thick, a contact resistance between the auxiliary electrode layer 25 and the second electrode layer 24 may increase.

In this way, when the transparent layer 26 is made of a transparent conductive material, a contact resistance between the second electrode layer 24 and the auxiliary electrode layer 25, or between the second electrode layer 24 and the bus electrode line 27, may decrease.

Figure 4:
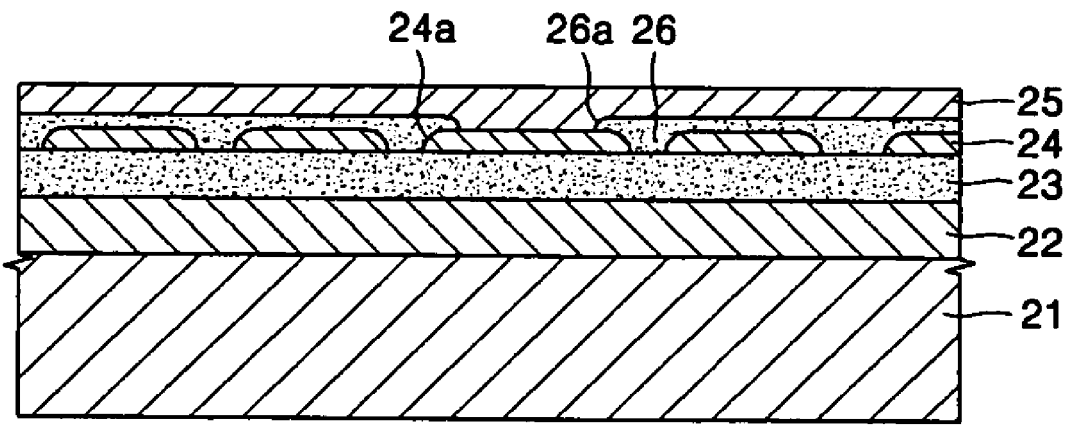
FIG. 4 is a cross-sectional view of an organic EL device including a transparent second electrode layer according to a third exemplary embodiment of the present invention.

Alternatively, the transparent layer 26 may be made of an insulating material. In this case, the transparent layer 26 may be formed with openings 26a to allow electrical communication between the second electrode layer 24 and the auxiliary electrode layer 25, as shown in FIG. 4. The auxiliary electrode layer 25 and the second electrode layer 24 can contact with each other through the openings 26a Although not shown, the openings 26a may also be applied in the exemplary embodiment of the present invention in which the bus electrode line 27 is used instead of the auxiliary electrode layer 25.

Figure 5:
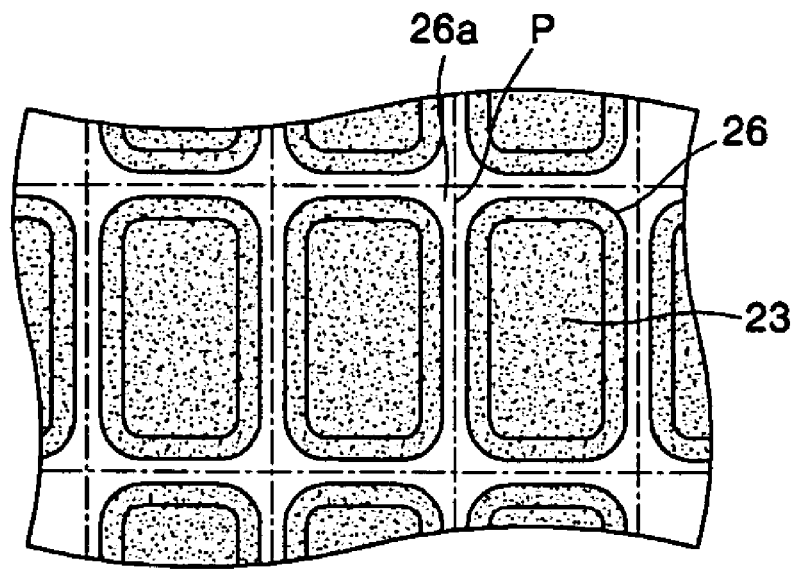
FIG. 5 and FIG. 6 are partial plan views of the organic EL device of FIG. 4.
Figure 6:
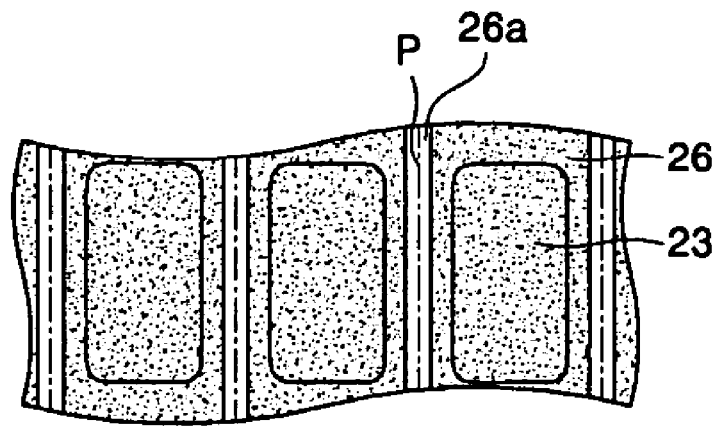

Preferably, the area of the transparent layer 26 formed with the openings 26a is larger than that of the organic layer 23 of each pixel P and smaller than that of each pixel P, as is shown in FIG. 5 and FIG. 6, which show alternative partial plan views of the device of FIG. 4. When the transparent layer 26 has an area at least as large as the organic layer 23 of each pixel P, it may effectively protect the organic layer 23. When the transparent layer 26 has an area smaller than each pixel P, the second electrode layer 24 and the auxiliary electrode layer 25 may electrically communicate with each other via the openings 26a, as shown in FIG. 4.

The transparent layer 26 may be patterned like an island type, as shown in FIG. 5, or it may be patterned like a stripe type, as shown in FIG. 6.

The transparent layer 26 made of an insulating material may be formed in the range of about 30 to about 1,000 Å thick. If the transparent layer 26 made of an insulating material is less than 30 Å thick, an underlying emitting area may be damaged during sputtering for the auxiliary electrode layer 25. On the other hand, if it is more than 1,000 Å, a light transmittance may decrease.

Figure 7:
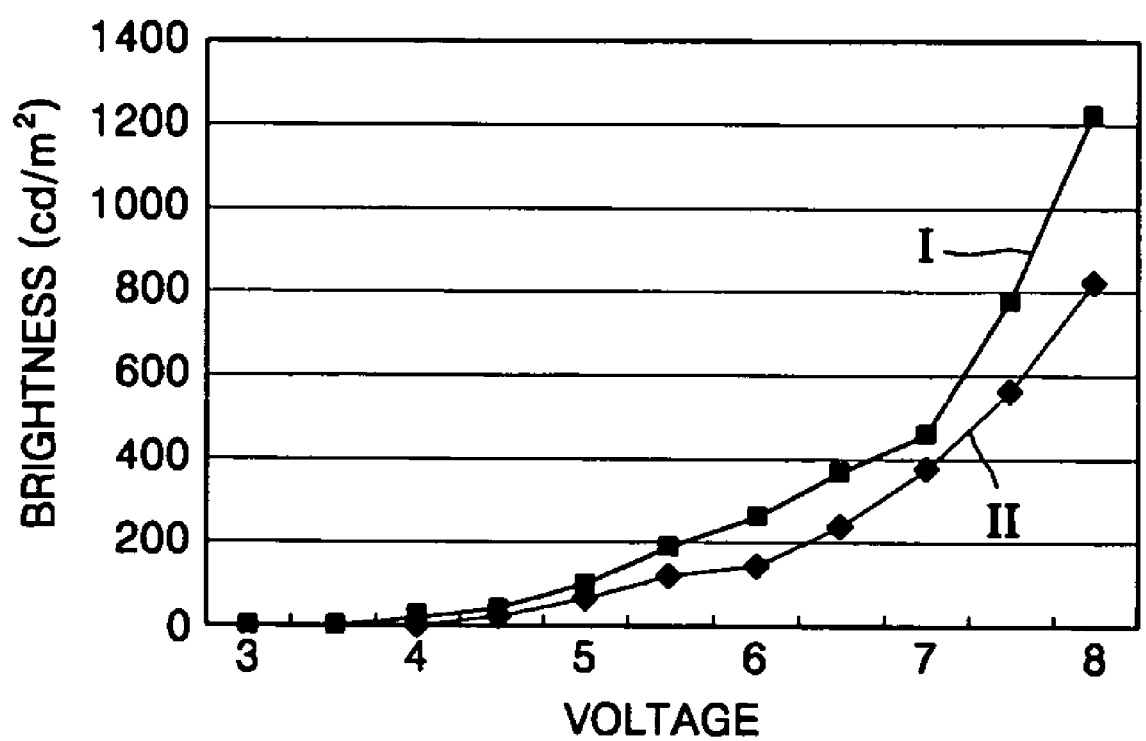
FIG. 7 is a graph showing brightness versus voltage for organic EL devices of an Example of an exemplary embodiment of the present invention and a Comparative Example.

FIG. 7 shows a change in brightness versus voltage for organic EL devices of Example (I) of an exemplary embodiment of the present invention and a Comparative Example (II).

The organic EL device of Example (I) is about 100 Å thick, and it includes a second electrode layer made of Mg:Ag, an auxiliary electrode layer made of IZO, and a transparent layer, which is located between the second electrode layer and the auxiliary electrode layer, made of LiF.

The organic EL device of Comparative Example (II) includes a second electrode layer made of Mg:Ag and an auxiliary electrode layer made of IZO.

As shown in FIG. 7, the organic EL device of Example (I) exhibits excellent brightness, compared to that of Comparative Example (II). Further, in the case of the organic EL device of Example (I), damage to an organic layer due to IZO deposition may be minimized, as described above.

As is apparent from the above description, exemplary embodiments of the present invention may have the following advantages.

First, formation of a transparent electrode as an upper electrode of an organic layer may prevent damage to the organic layer.

Second, formation of a transparent dual electrode as an upper electrode of an organic layer may reduce a contact resistance of the dual electrode.

Third, reduction of luminance efficiency may be prevented in a both-direction emission type, as well as in a front emission type.

Fourth, formation of a transparent dual electrode as an upper electrode of an organic layer may protect the organic layer from plasma or energetic particles.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent (EL) device, comprising:
   a substrate;
   a first electrode layer formed on the substrate;
   a second electrode layer formed on the first electrode layer;
   an organic layer interposed between the first electrode layer and the second electrode layer; and
   a transparent layer formed on the second electrode layer and arranged between the organic layer and a side of the organic EL device from which light is emitted, wherein the transparent layer comprises a material having a non-variable resistance.

2. The organic EL device of claim 1, wherein the transparent layer is formed like an island or a stripe.

3. The organic EL device of claim 1, wherein the transparent layer is made of Li, Ca, LiF/Ca, LiF/Al, Al, Mg, or Mg alloy.

4. The organic EL device of claim 1, wherein the transparent layer is made of a transparent insulating material.

5. The organic EL device of claim 4, wherein the transparent layer is within a range of about 30 Å to about 1,000 Å thick.

6. The organic EL device of claim 4, wherein the transparent layer has an area larger than an emitting area of the organic layer and smaller than a single pixel area.

7. The organic EL device of claim 4, further comprising:
an auxiliary electrode layer formed on the transparent layer,
wherein the auxiliary electrode layer is made of ITO, IZO, ZnO, or $In_2O_3$, and
wherein the auxiliary electrode layer is coupled to the second electrode layer.

8. The organic EL device of claim 4, further comprising:
a bus electrode line formed on the transparent layer,
wherein the bus electrode line is coupled to the second electrode layer.

9. The organic EL device of claim 1, wherein the transparent layer is made of a transparent conductive material.

10. The organic EL device of claim 9, wherein the transparent layer is within a range of about 30 Å to about 1,500 Å thick.

11. The organic EL device of claim 9, wherein the transparent conductive material is a conductive organic material.

12. The organic EL device of claim 11, wherein the transparent layer is within a range of about 100 Å to about 1,500 Å thick.

13. The organic EL device of claim 9, wherein the transparent conductive material is a metal.

14. The organic EL device of claim 13, wherein the transparent layer is within a range of about 30 Å to about 1,000 Å thick.

15. The organic EL device of claim 9, further comprising:
an auxiliary electrode layer formed on the transparent layer, wherein the auxiliary electrode layer is made of ITO, IZO, ZnO, or $In_2O_3$, and
wherein the auxiliary electrode layer is coupled to the second electrode layer.

16. The organic EL device of claim 9, further comprising:
a bus electrode line formed on the transparent layer,
wherein the bus electrode line is coupled to the second electrode layer.

17. The organic EL device of claim 1, wherein the second electrode layer is a metal thin film within the range of about 40 Å to about 200 Å thick.

18. The organic EL device of claim 1, further comprising:
an auxiliary electrode layer formed on the transparent layer, wherein the auxiliary electrode layer is made of ITO, IZO, ZnO, or $In_2O_3$, and
wherein the auxiliary electrode layer is coupled to the second electrode layer.

19. The organic EL device of claim 1, further comprising:
a bus electrode line formed on the transparent layer,
wherein the bus electrode line is coupled to the second electrode layer.

20. The organic EL device of claim 1, wherein the second electrode layer is a transparent electrode.

21. The organic EL device of claim 1, wherein the transparent layer comprises an opening exposing the second electrode layer.

22. The organic EL device of claim 21, further comprising:
an auxiliary electrode layer formed on the transparent layer,
wherein the auxiliary electrode layer is made of ITO, IZO, ZnO, or $In_2O_3$, and
wherein the auxiliary electrode layer is coupled to the second electrode layer via the opening.

23. The organic EL device of claim 21, further comprising:
a bus electrode line formed on the transparent layer,
the bus wherein electrode line is coupled to the second electrode layer via the opening.

* * * * *